United States Patent [19]

Girgis

[11] Patent Number: 4,661,769

[45] Date of Patent: Apr. 28, 1987

[54] MEASUREMENT OF MAGNITUDE AND PHASE ANGLE OF VOLTAGE AND CURRENT PHASORS AND FREQUENCY DEVIATION IN POWER SYSTEMS

[75] Inventor: Adly A. Girgis, Burlington, N.C.

[73] Assignee: North Carolina State University, Raleigh, N.C.

[21] Appl. No.: 693,765

[22] Filed: Jan. 23, 1985

[51] Int. Cl.[4] ............................................. G01R 23/02
[52] U.S. Cl. .................................. 324/78 Z; 324/83 R
[58] Field of Search .................. 324/78 Z, 78 R, 78 F, 324/82, 79 R; 364/484, 572, 483; 307/511, 514, 518; 328/155, 141; 363/39

[56] References Cited

U.S. PATENT DOCUMENTS

| 3,235,800 | 2/1966 | Turrell | 324/83 A |
| 4,455,612 | 6/1984 | Girgis et al. | 364/483 |
| 4,547,726 | 10/1985 | Premerlani | 324/78 Z |

Primary Examiner—Michael J. Tokar
Attorney, Agent, or Firm—Bell, Seltzer, Park & Gibson

[57] ABSTRACT

Methods for determining magnitude, phase angle and frequency deviation in the sinusoid waveform output of electrical power generation equipment are disclosed. The first method uses a two-state linear Kalman filter to calculate the magnitude and phase angle from which the frequency deviation is calculated using the linear relationship between frequency deviation and the average rate of change of phase angle. In a second method, a three-state extended Kaman filter is employed. The frequency deviation is considered a third state variable and is recursively computed on-line.

10 Claims, 9 Drawing Figures

MEASUREMENT OF MAGNITUDE AND PHASE ANGLE OF VOLTAGE AND CURRENT PHASORS AND FREQUENCY DEVIATION IN POWER SYSTEMS

FIELD OF THE INVENTION

This invention relates generally to the power system (generation, transmission, distribution) industry, and more specifically to a method for measuring the magnitude and phase angle of voltage and current phasors and frequency deviation in power systems.

BACKGROUND OF THE INVENTION

Frequency deviation in power generating systems has been a longstanding significant problem.

In the United States, electrical generating equipment is designed to output a 60 hertz wave (50 hertz elsewhere), and although the frequency is closely controlled, some deviation is inevitable as a result of sudden variations in the electrical load, lightning striking transmission equipment and a number of other factors. Frequency deviations in the output on the order of ±0.5 hertz are within acceptable limits, but any frequency deviation greater than 0.5 hertz, even those lasting only minutes, can cause significant damage to the generator, thus shortening the useful life of an asset often costing hundreds of thousands of dollars.

Several attempts have been made by others to solve this problem in order to prolong the life of the generating equipment. Most of these techniques exhibit a common deficiency in that they make simplifying assumptions about the output waveform which are incorrect, thus introducing their own error into the assumed correction. For example, many of these techniques incorrectly assume that the waveform to be analyzed is a pure sine wave, and that the time between zero crossings of the waveform may be considered an indication of the frequency from which the frequency deviation may be derived. While permitting the introduction of a correction factor, these assumptions introduce error of their own into the correction factor.

Other techniques convert the frequency variation into a proportional voltage output by using phase locked loops, the latter then being used to provide an output voltage based on the rate of change. This rate of change is obtained by using level detectors where the difference between the levels is used as indicative of rate of change of the frequency. In another technique, a few complete cycles of the output waveform are clocked and the output frequency corresponding to each cycle is calculated. Using this information, a curve fit technique is then employed to determine the rate of change of frequency. All of these techniques are deficient in that the accuracy of the estimated frequency deviation is affected by any non-60 hertz component that might be present in the voltage waveform.

In an attempt to overcome these deficiencies, techniques based on discrete Fourier transforms (DFT) have been developed. One such technique, termed the "leakage coefficient" technique, is based on the fact that all of the discrete Fourier transform components will be non zeros if any frequency deviation is present in the output waveform. However, prefiltering of the data is required before calculating the frequency deviation in order to avoid errors due to the presence of harmonics. The accuracy of DFT-based techniques may be affected by the presence of harmonics and/or the presence of white noise.

With the foregoing in mind, it is an object of the present invention to provide a technique for the estimation of frequency deviation which is not based on simplifying assumptions about the waveform to be measured.

Another object of the present invention is to provide a technique for the estimation of frequency deviation which is immune to errors induced by the presence of waveform harmonics or other noise signals.

A further object of the present invention is to provide a technique for the estimation of frequency deviation wherein prefiltering of the waveform output is not required.

A still further object of the invention is to provide a technique wherein measurement of the waveform output may be started at any point of the cycle of the periodic AC waveform.

SUMMARY OF THE INVENTION

The foregoing objects of the present invention are accomplished by a method of determining frequency deviation in the sinusoid waveform output of electrical power generation apparatus wherein the voltage output of the sinusoid waveform is successively sampled. In response to said successive sampling, a voltage waveform sinusoid estimate is recursively electronically calculated by optimal estimation using state variables, then the magnitude and phase angle of the sample are electronically calculated from the state variables. Finally, the frequency deviation of the voltage waveform is electronically calculated by linearly relating the frequency deviation to the average rate of change of the phase angle.

BRIEF DESCRIPTION OF THE DRAWINGS

Some of the features and advantages of the invention having been briefly stated, others will appear from the detailed specification which follows, when taken in connection with the accompanying drawings, in which.

DETAILED DESCRIPTION OF THE ILLUSTRATED EMBODIMENTS

Figure 1:
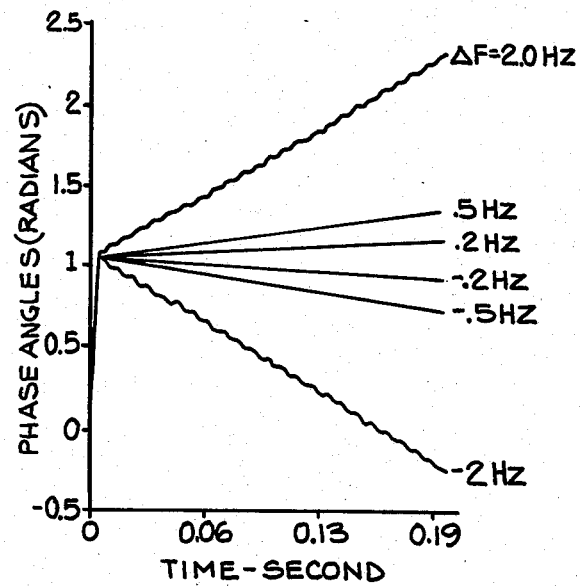
FIG. 1 illustrates the relation between phase angle and frequency deviation using the two-state Kalman filter and noise-free data.

While the present invention will be described more fully hereinafter with reference to the accompanying drawings, in which particular test results are shown, it is to be understood at the outset that persons of skill in the art may modify the invention herein described while still achieving the favorable results of this invention. Accordingly, the description which follows is to be understood as being a broad teaching disclosure directed to persons of skill in the appropriate arts, and not as limiting upon the present invention.

The methods of the present invention utilize the principles of discrete Kalman filtering which are well known to persons in the art of systems control theory. Therefore, the Kalman filter equations are not derived herein, but rather the reader is referred to the texts by R. G. Brown, "Introduction to Random Signal Analysis and Kalman Filtering", John Wiley & Sons, Inc., 1983 and Gelb, Arthur, editor, "Applied Optimal Estimation," M.I.T. Press, 1974. The Kalman filter equations are presented hereinafter in the form required for application to the instant system. In addition, the measurement equations and the filter recursive equations are presented with a brief description of their use. The invention comprises two methods for determining frequency deviation in the output wave of electrical generation equipment. One method utilizes a two state Kalman filter and the other utilizes a three state Kalman filter.

In the implementation of a two-state Kalman filter, a mathematical model (in state variable form) of the signals or the states to be estimated is assumed to be of the form:

$$X_{K+1} = \phi_k x_k + w_k \tag{1}$$

where
- $x_k$ is the nx1 process state vector at step k (nx1 represents the vector comprised of a single column of n elements).
- $\phi k$ is the nxn state transition matrix (nxn represents the matrix comprised of n rows and n columns).
- $W_k$ is an nx1 vector uncorrelated sequence with known covariance structure (nx1 represents the vector comprised of a single column of n elements)

The measurement of the process is assumed to be of the form $$Z_K = H_k X_k + v_k \tag{2}$$

where
- $z_k$ is the mx1 vector measurement at step k
- $H_k$ is the mxn matrix giving the ideal connection between the measurement and the state vector
- $V_k$ is the mx1 measurement error-assumed to be uncorrelated with known covariance structure.

It is also assumed that the measurement noise and system noise are uncorrelated.

Having an estimate $\hat{x}_k^-$ and its error covariance $P_k^-$ the general recursive Kalman filter equations are as follows:

(i) Compute Kalman filter gain $K_k$:
ti $K_k = P_k^- H_k^T (H_k P_k^- H_k^T + R_k)^{-1}$ (3)

(ii) Update estimate with measurement $z_k$:

$$\hat{x}_k = \hat{x}_k^- + K_k(z_k - H_k \hat{x}_k^-) \tag{4}$$

(iii) Compute error covariance for update estimate:

$$P_k = (I - K_k H_k) P_k^- \tag{5}$$

(iv) Project ahead:

$$\hat{x}_{k+1}^- = \phi_k \hat{x}_k \tag{6}$$

$$P_{k+1}^- = \phi_k P_k \phi_k^T + Q_k \tag{7}$$

where I is an indentity matrix. It should be noted that equations (3),(5) and (7) are independent of the measurement and the estimates. Therefore, only equations (4) and (6) are computed online.

State Model of the Signal

The noise-free voltage signal can be expressed by the real part of $$s(t) = A \exp(j\omega t + \phi) \tag{8}$$

where A is the amplitude and $\phi$ is the phase angle. Considering a Rayleigh distribution for the amplitude and a uniform distribution for the phase angle, the noise-free voltage signal may be expressed as $$s(t) = x1 \cos\omega_o t - x2 \sin\omega_o t \tag{9}$$

Therefore, the two state variables to be estimated are x1 and x2, the in-phase and quadrature-phase components. With this representation x1 and x2 are random constants with Gaussian distribution. Thus the state transition matrix may be written as $$\phi_k = \begin{bmatrix} 1.0 & 0.0 \\ 0.0 & 1.0 \end{bmatrix} \tag{10}$$

The measurement equation will then be $$z_k = [\cos(\omega_o k \Delta t) \quad -\sin(\omega_o k \Delta t)] \begin{bmatrix} x1 \\ x2 \end{bmatrix} + v_k \tag{11}$$

The initial covariance matrix is chosen to represent the maximum of the voltage input into the filter per unit with no prior information. A value of 2 per unit for the diagonal elements was found to be reasonable. The noise variance is assumed to be constant. According to the description mentioned above, only one equation needs to be computed on-line. This equation may be written as $$\hat{x}_k = \hat{x}_{k-1} + K_k(Z_k - H_k \hat{x}_{k-1}) \tag{12}$$

The reader will note that the calculation of the two state variables x1 and x2 using equation (12) requires four multiplications and four additions. With proper choice of sampling rate, the number of multiplications may be reduced to two.

Calculation of Frequency Deviation

Having the two state variables, x1 and x2, estimated using (12), the magnitude and phase angle are computed. Through extensive runs it was determined that the frequency deviation in Hertz is linearly related to the average rate of change of the phase angle, using the Kalman filter estimates, by the following equation $$\frac{\partial \phi}{\partial t} \text{ (radians/sec)} = \pi \Delta f \text{(Hz)} \quad (13)$$

Representing the Frequency Deviation by a State Variable

Consider the signal represented by equation (8) where the frequency $\omega$ deviates from $\omega_o$ by $\Delta\omega$. Thus $$s(t) = A \cos[(\omega_o + \Delta\omega)t + \theta] \quad (14)$$

Representing the frequency deviation $\Delta f$ by a third state variable x3, the signal can be expressed as $$s(t) = x1\cos(\omega_o t + 2\pi x 3 t) - x2\sin(\omega_o t + 2\pi x 3 t) \quad (15)$$

Thus the measurement equation may be rewritten as $$z_k = h_k(x) + v_k \quad (16)$$

where $$h_k(x) = x1_k \cos(\omega_o k\Delta t + 2\pi x3 k\Delta t) - x2_k \sin(\omega_o k\Delta t + 2\pi x3 k\Delta t) \quad (17)$$

This formulation led to the extended Kalman filter algorithm. The theory and derivation of the extended Kalman filter equations can be found in many references including the aforementioned texts by Brown and Gelb. Only the necessary equations will be mentioned here.

Extended Kalman Filter Equations

The state equations are similar to equation (1) with a 3×3 identity matrix as the state transition matrix. The measurement equation is given by (16). The recursive equations are slightly different than the linear Kalman filter model and are given as (i) Kalman filter gain:

$$K_k = P_k^- H_k^T(\hat{x}_k^-)(H_k(\hat{x}_k^-) P_k^- H_k^T(\hat{x}_k^-) + R_k)^{-1} \quad (18)$$

where $$H_k(\hat{x}_k^-) = \left.\frac{\partial h_k(x)}{\partial x_k}\right|_{x_k = \hat{x}_k^-} \quad (19)$$

(ii) State estimate update:

$$\hat{x}_k = \hat{x}_k^- + K_k(z_k - h_k(\hat{x}_k^-)) \quad (20)$$

(iii) Error covariance update:

$$P_k = [I - K_k H_k(\hat{x}_k^-)] P_k^-$$

Using equations (17) and (19) the three components of $H_k(\hat{x}_k^-)$ may be defined as follows:

$$H11_k = \cos(\omega_o k\Delta t + 2\pi \hat{x}3_k k\Delta t) \quad (22)$$

$$H12_k = -\sin(\omega_o k\Delta t + 2\pi \hat{x}3_k k\Delta t) \quad (23)$$

$$H13_k = 2\pi(H12_k \hat{x}1_k - H11_k \hat{x}2_k) k\Delta t \quad (24)$$

The following test results were obtained by implementing the Kalman filter algorithms on a UNIX/VAX 11-780 computer. The data consisted of a sinusoidal waveform with magnitude and phase angle preselected and a zero mean Gaussian white noise superimposed thereon to represent the noisy measurements as reported by EPRI, "Study of Distribution System Surge and Harmonic Characteristic," EPRI EL-1627 Project 1024-1, Final Report, November, 1980. In addition, simulations were conducted using sampling rates ranging from 4 samples/cycle to 16 samples/cycle.

The accuracy and versatility of the model were tested by changing the input signal parameters and comparing the response of the model under the changed conditions to the known conditions. The two-state Kalman filter model was first tested on a noise free data and then on a noisy data where the standard deviation of the noise was 10 (ten) percent of the peak of the sinusoidal wave. In addition, simulations were made with different frequency deviations and continuously increasing frequency deviation.

One of the objects of testing the Kalman filter model on noise-free data was to find the exact relation between the rate of change of the phase angle and the frequency deviation. To achieve this objective, the phase angle was calculated for different frequency deviations. FIG. 1 shows how the phase angle varies with time for frequency deviations ranging from −2 Hz to +2 Hz.

From the results shown in FIG. 1, it was concluded that the average rate of change of the phase angle can be expressed by equation (13). To have an accurate estimate of the frequency deviation, the average rate of change of the phase angle was computed over a period of two cycles. With noise free data equation (13) computed the exact value of frequency deviation.

Figure 2:
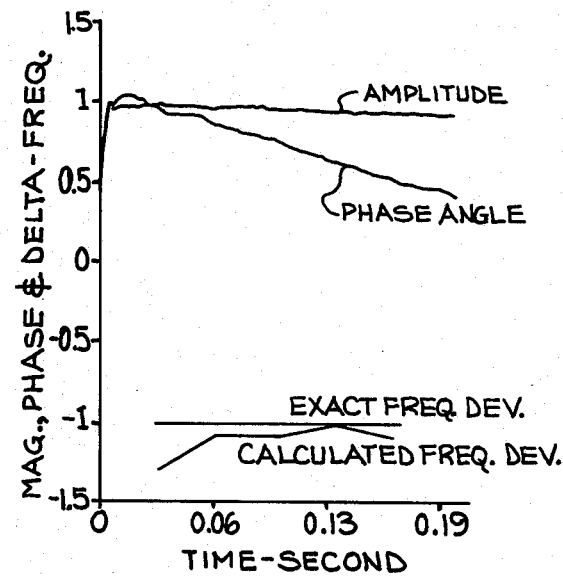
FIG. 2 illustrates signal amplitude, phase angle and computed frequency deviation using the two-state Kalman filter for noisy data and a constant frequency deviation.

To study the effect of noise, the standard deviation of the noise was changed from small values (0.01) to large values (0.2). The results showed that the estimates of the magnitude and phase using the two-state Kalman filter model are only slightly affected by the noise level. FIG. 2 shows the magnitude, phase angle and frequency deviation computed using equation (13) when the noise has a standard frequency deviation of 10 (ten) percent.

Figure 3:
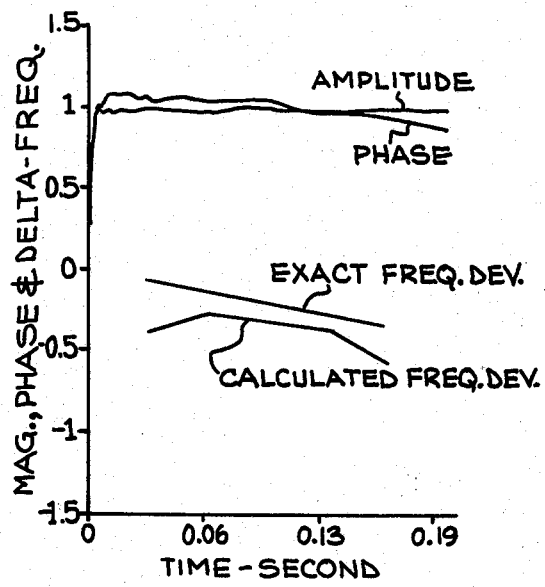
FIG. 3 illustrates test results of the two-state Kalman filter model on noisy data and continuously increasing frequency deviation.

FIG. 3 illustrates test results of the two-state Kalman filter model on noisy data and continuously increasing frequency deviation. It will be seen that the initial error decreased monotonically with time.

Figure 4:
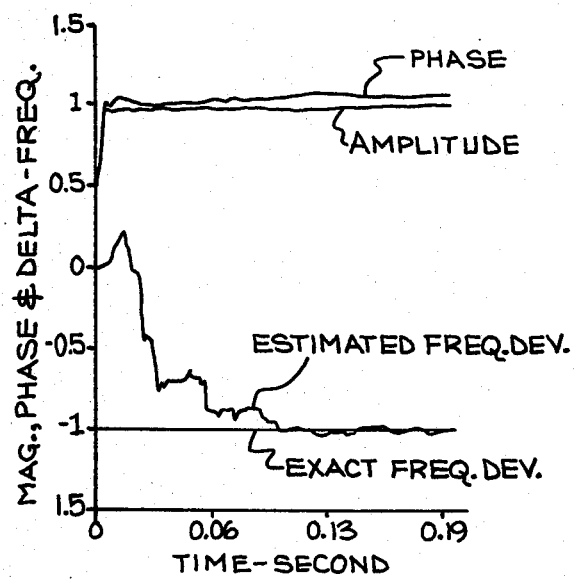
FIG. 4 illustrates the estimated amplitude phase angle, and frequency deviation using the three-state Kalman filter model on noisy data and a constant frequency deviation.
Figure 5:
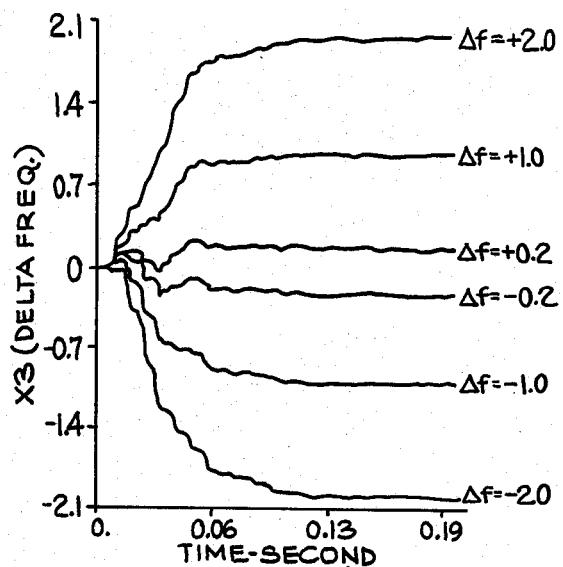
FIG. 5 illustrates the estimated frequency deviations for different cases that have frequency deviations varying from −2 Hertz to +2 Hertz.
Figure 6:
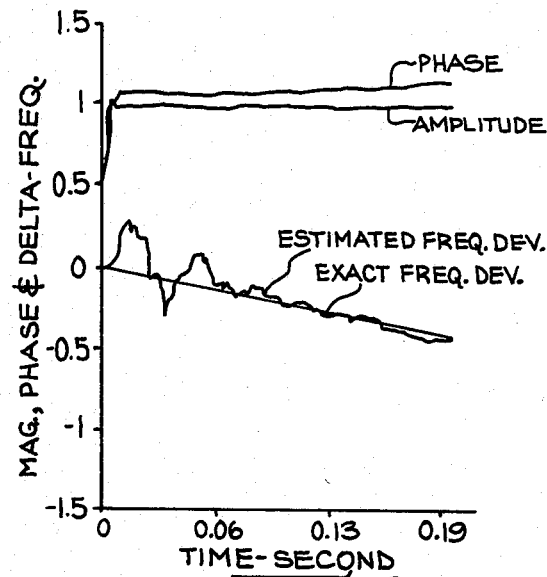
FIG. 6 illustrates the estimated amplitude, phase angle and frequency deviation using the three-state Kalman filter model on noisy data and continuously increasing frequency deviation.

In the two-state Kalman filter model, the frequency deviation is calculated using the average rate of change of the phase angle. Therefore, any small error in the phase angle will result in higher error in the computation of the frequency deviation. To reduce this error, averaging over a longer period of time may be implemented. Alternatively, the frequency deviation may be obtained directly from the three-state extended Kalman filter model. This three-state model is a different model representation for the frequency deviation. Examples of these models are: random constant, random walk, or a combination of both. The results showed that the frequency deviation converged to a reasonably accurate value within 0.1 sec (6 cycles). Using the three-state Kalman filter model, FIG. 4 shows the estimated magnitude, phase angle and frequency deviation of noisy data and a constant frequency deviation; FIG. 5 shows the estimated frequency deviations for different cases that have frequency deviations varying from −2 Hz to +2 Hz; and FIG. 6 shows the results for noisy data and continuously increasing frequency deviation.

Figure 7:
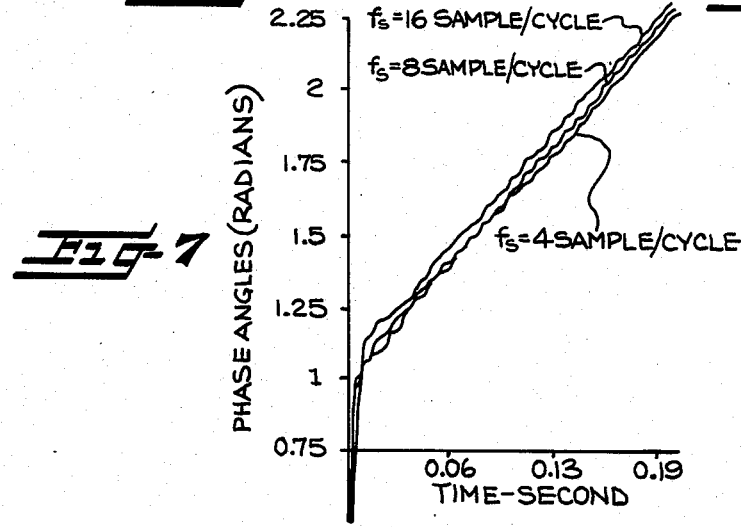
FIG. 7 illustrates the effect of sampling rate on the phase angle of the two-state Kalman filter model where the frequency deviation is 2 Hertz.

The two-state Kalman filter model requires, in general, four multiplications and four additions. This is a relatively low computer burden for present day microprocessors. However, reducing the sampling rate to four samples per cycle would reduce the number of multiplications to two. The question now is how would the accuracy be affected by reducing the sampling rate? To answer this question the two-state model was tested on different sampling rates namely 16, 8, and 4 samples per cycle. FIG. 7 shows the phase angle vs. time for the previously mentioned sampling rates. As can be shown from these results, the sampling rate may be reduced to four samples per cycle and the results will still be reasonably accurate.

Figure 8:
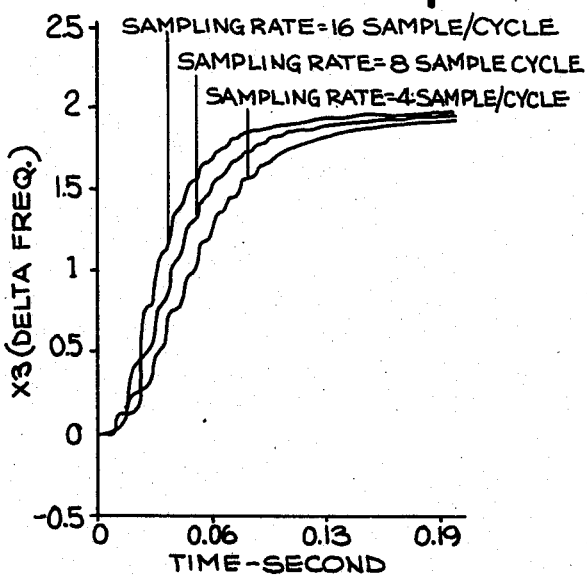
FIG. 8 illustrates the effect of sampling rate on the estimated frequency deviation of the three-state extended Kalman filter model where the frequency deviation is 2 Hertz.

The three-state extended Kalman filter model requires the on-line computation of the Kalman filter gain. Therefore, the number of multiplications in the three-state model is higher than the number of multiplications in the two-state model. Although the three-state model will not represent a heavy computer burden, it will be beneficial if the sampling rate is reduced without jeopardizing the accuracy of the estimates. Testing the three-state model on different sampling rates, namely from 16 to 4 samples per cycle, the settling time of the estimated frequency deviation increased at a lower sampling rate. However, the estimated magnitude and phase were practically unaffected by reducing the sampling rate. FIG. 8 shows the estimated frequency deviation of the three state extended Kalman filter for sampling rates of 16, 8, and 4 samples per cycle.

Figure 9:
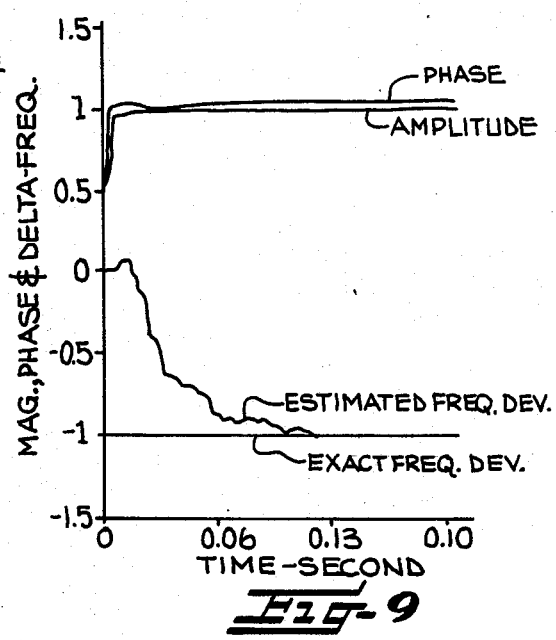
FIG. 9 illustrates the simulation results obtained with the extended Kalman filter model where the signal includes a noise standard deviation of 5 percent.

To study the effect of the noise level, different runs were made with different standard deviations of the noise. It was observed that the noise level affected the fluctuations of the phase angle in the two-state Kalman filter model and the fluctuations of the estimated frequency deviation of the three-state Kalman filter model. FIG. 9 shows the estimated magnitude, phase angle and frequency deviation using the three-state extended Kalman filter model at a reduced noise level. It should be mentioned that the standard deviation of the reduced noise level of FIG. 9 is 5 percent of the peak of the fundamental component.

Comparing FIG. 9 with FIG. 4, it can be observed that the settling time of the estimated frequency deviation is not sensitive to the noise level.

In the drawings and specification there have been set forth preferred embodiments of the invention, and although specific terms are employed, they are used in a generic sense only and not for the purposes of limitation.

That which is claimed is:

1. A method of determining frequency deviation in the sinusoid wavefrom output of electrical power generation apparatus characterized by the fact that the method is accurate in the presence of noise and that it minimizes error introudced by such noise comprisng the steps of:

successively sampling the voltage output of the sinusoid waveform of an electrical power generation apparatus;

recursively electronically calculating in response to said successive sampling a voltage waveform sinusoid estimate by optimal estimation using state variables, said optimal estimation including electronically calculating the magnitude and phase angle of said sample from said state variables; and electronically calculating the frequency deviation of said voltage waveform by linearly relating the frequency deviation to the average rate of change of said phase angle.

2. The method of determining frequency deviation claimed in claim 1 wherein said optimal estimation procedure uses two state variables.

3. The method of determining frequency deviation claimed in claim 1 wherein said successive sampling uses successive pairs of successive samples.

4. The method of determining frequency deviation claimed in claim 2 wherein the two state variables of said frequency deviation estimation procedure correspond to the amplitudes in-phase and quadrature-phase.

5. The method of determining frequency deviation claimed in claim 1 wherein said estimation procedure is in accordance with discrete Kalman Filtering.

6. A method of determining frequency deviation in the sinusoid waveform output of electrical power generation apparatus characterized by the fact that the method is accurate in the presence of noise and that it minimizes error introduced by such noise comprising the steps of:

successively sampling the voltage output sinusoid waveform of an electrical power generation apparatus;

recursively electronically calculating in response to said successive sampling, a voltage waveform sinusoid estimate by means of an estimation procedure having three state variables and wherein one of said three state variables corresponds to the frequency deviation of said output sinusoid waveform.

7. The method of determining frequency deviation claimed in claim 6 wherein said successive sampling uses successive pairs of successive samples.

8. The method of determining frequency deviation claimed in claim 6 wherein the three state variables of said frequency deviation estimation procedure correspond to the amplitudes in-phase and quadrature-phase and frequency deviation.

9. The method of determining frequency deviation claimed in claim 6 wherein said estimation procedure is in accordance with discrete Kalman Filtering.

10. The method of determining frequency deviation claimed in claim 6 wherein said estimation procedure is in accordance with extended Kalman Filtering.

* * * * *

UNITED STATES PATENT AND TRADEMARK OFFICE
CERTIFICATE OF CORRECTION

PATENT NO. : 4,661,769
DATED : April 28, 1987
INVENTOR(S) : Adly A. Girgis

It is certified that error appears in the above-identified patent and that said Letters Patent is hereby corrected as shown below:

Column 3, Line 68 -- omit the letters "ti" before formula (3)

Signed and Sealed this

First Day of September, 1987

Attest:

DONALD J. QUIGG

Attesting Officer

Commissioner of Patents and Trademarks